US006239624B1

(12) United States Patent
Yang et al.

(10) Patent No.: US 6,239,624 B1
(45) Date of Patent: May 29, 2001

(54) LOW-POWER SENSE AMPLIFIER FOR MEMORY

(75) Inventors: Jeong-Sik Yang; Beomsup Kim, both of Taejon-si (KR)

(73) Assignee: Korea Advanced Institute of Science and Technology, Taejon-si (KR)

( * ) Notice: Subject to any disclaimer, the term of this patent is extended or adjusted under 35 U.S.C. 154(b) by 0 days.

(21) Appl. No.: 09/337,150

(22) Filed: Jun. 21, 1999

(30) Foreign Application Priority Data

Jul. 28, 1998 (KR) .................................. 98-30406

(51) Int. Cl.[7] .................................................. G01R 19/00
(52) U.S. Cl. .................................. 327/55; 327/51
(58) Field of Search .................. 327/51, 52, 54, 327/55, 57, 63, 65, 67; 365/189.05, 189.07; 330/252, 253

(56) References Cited

U.S. PATENT DOCUMENTS

| 4,845,675 | * | 7/1989 | Krenik et al. ................. 365/203 |
| 5,410,268 | * | 4/1995 | Sharpe-Geisler ............... 327/51 |
| 5,465,060 | * | 11/1995 | Pelella .......................... 327/51 |
| 5,563,533 | * | 10/1996 | Cave et al. .................... 327/67 |
| 5,696,726 | * | 12/1997 | Tsukude ....................... 365/205 |
| 5,696,727 | * | 12/1997 | Tsukude et al. ............... 365/208 |

FOREIGN PATENT DOCUMENTS

403052195A * 3/1991 (JP) ........................................ 327/52

OTHER PUBLICATIONS

IEEE Journal of Solid–State Circuits, vol. 29, No. 4, Apr. 1994, by Koichiro Ishibashi et al.

* cited by examiner

Primary Examiner—Kenneth B. Wells
Assistant Examiner—Hai L. Nguyen
(74) Attorney, Agent, or Firm—Bachman & LaPointe, P.C.

(57) ABSTRACT

A low-power sense amplifier for a memory is provided, which includes a differential amplifier for sensing and amplifying a weak voltage signal of a bit line connected to a memory cell, and a latch amplifier for storing data inputted thereto, the latch amplifier being operated by the output signal of the differential amplifier, the sense amplifier including a bias means constructed of transistors which are included in the differential amplifier and turned on or turned off by a control signal, the transistors providing a load resistor component required for driving the differential amplifier when it is turned on, and a cutoff means for turning off the transistors constructing the bias means to stop the operation of the differential amplifier when there is a first logic state signal among the output signals of the latch amplifier. Accordingly, the low-power sense amplifier for a memory can perform high-speed sense amplification of bit line signal and prevent unnecessary power consumption.

2 Claims, 4 Drawing Sheets

LOW-POWER SENSE AMPLIFIER FOR MEMORY

BACKGROUND OF THE INVENTION

1. Field of the Invention

The present invention relates to a sense amplifier for amplifying a signal having a small magnitude, generated in a bit line of a memory, with a low power, specifically, to a low-power two-stage sense amplifier for a memory, the first stage being a differential amplifier for amplifying a weak signal from a bit line of the memory and transmitting the amplified signal to the second stage which sufficiently amplifies the signal from the first stage and passes it through a cutoff circuit, to cut off the power unnecessarily consumed at the first stage, thereby reducing the consumption power.

2. Discussion of Related Art

Highly integrated large-scaled semiconductor devices require large amount of power consumed in chips. While the operation speed of the chip was formerly regarded important more than its consumption power, both factors now become important as portable devices are increasingly used. In a system including a memory chip, this memory chip increasingly consumes power. Thus, it is preferred that the power consumed in the memory chip is reduced.

A conventional sense amplifier is constructed of two stages, the first of which uses a differential amplifier or latch amplifier, the second of which generally uses a latch amplifier. Thus, the sense amplifier is usually divided into a differential amplifier-latch amplifier type and a latch amplifier-latch amplifier type. In the operation characteristic of each of these sense amplifiers, the differential amplifier-latch amplifier amplifies a data signal having smaller magnitude sent from the bit line using the first-stage differential amplifier, and stores the amplified signal using the second-stage latch amplifier to allow the data signal to be used in the next stage. In this configuration, however, the latch amplifier consumes power even after data storage in terms of the characteristic of differential amplifier, resulting in excessive waste of power.

The latch amplifier-latch amplifier type has been proposed for the purpose of solving the problem of the differential amplifier-latch amplifier type sense amplifier. Though this amplifier consumes power less than the differential amplifier-latch amplifier, it is sensitive to offset voltage which is inevitably generated due to the characteristic of memory in terms of the characteristic of latch amplifier, being unable to be operated before the signal from the bit line exceeds a predetermined level. Thus, its operation speed is slower than that of the differential amplifier-latch amplifier. The operation characteristics of the above two different types of sense amplifiers are described in detail in JSSC, Katsuro Sasaki, p1075–p1081. Therefore, there are limitations in reducing consumption power while increasing operation speed in case of the conventional sense amplifiers.

SUMMARY OF THE INVENTION

Accordingly, the present invention is directed to a low-power sense amplifier for a memory that substantially obviates one or more of the problems due to limitations and disadvantages of the related art.

An object of the present invention is to provide a low-power sense amplifier for a memory, the sense amplifier consisting of two stages, the first stage being a differential amplifier for amplifying a weak signal from a bit line of the memory and transmitting the amplified signal to the second stage which sufficiently amplifies the signal from the first stage and passes it through a cutoff circuit, to cut off the power unnecessarily consumed at the first stage, thereby reducing the consumption power.

To accomplish the object of the present invention, there is provided a low-power sense amplifier for a memory, which includes a differential amplifier for sensing and amplifying a weak voltage signal of a bit line connected to a memory cell, and a latch amplifier for storing data inputted thereto, the latch amplifier being operated by the output signal of the differential amplifier, the sense amplifier including a bias means constructed of transistors which are included in the differential amplifier and turned on or turned off by a control signal, the transistors providing a load resistor component required for driving the differential amplifier when it is turned on, and a cutoff means for turning off the transistors constructing the bias means to stop the operation of the differential amplifier when there is a first logic state signal among the output signals of the latch amplifier.

In a preferred embodiment of the present invention, when the transistors constructing the bias means are PMOSs, the first logic state signal is a low-level voltage signal, and the cutoff means is an inverter.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
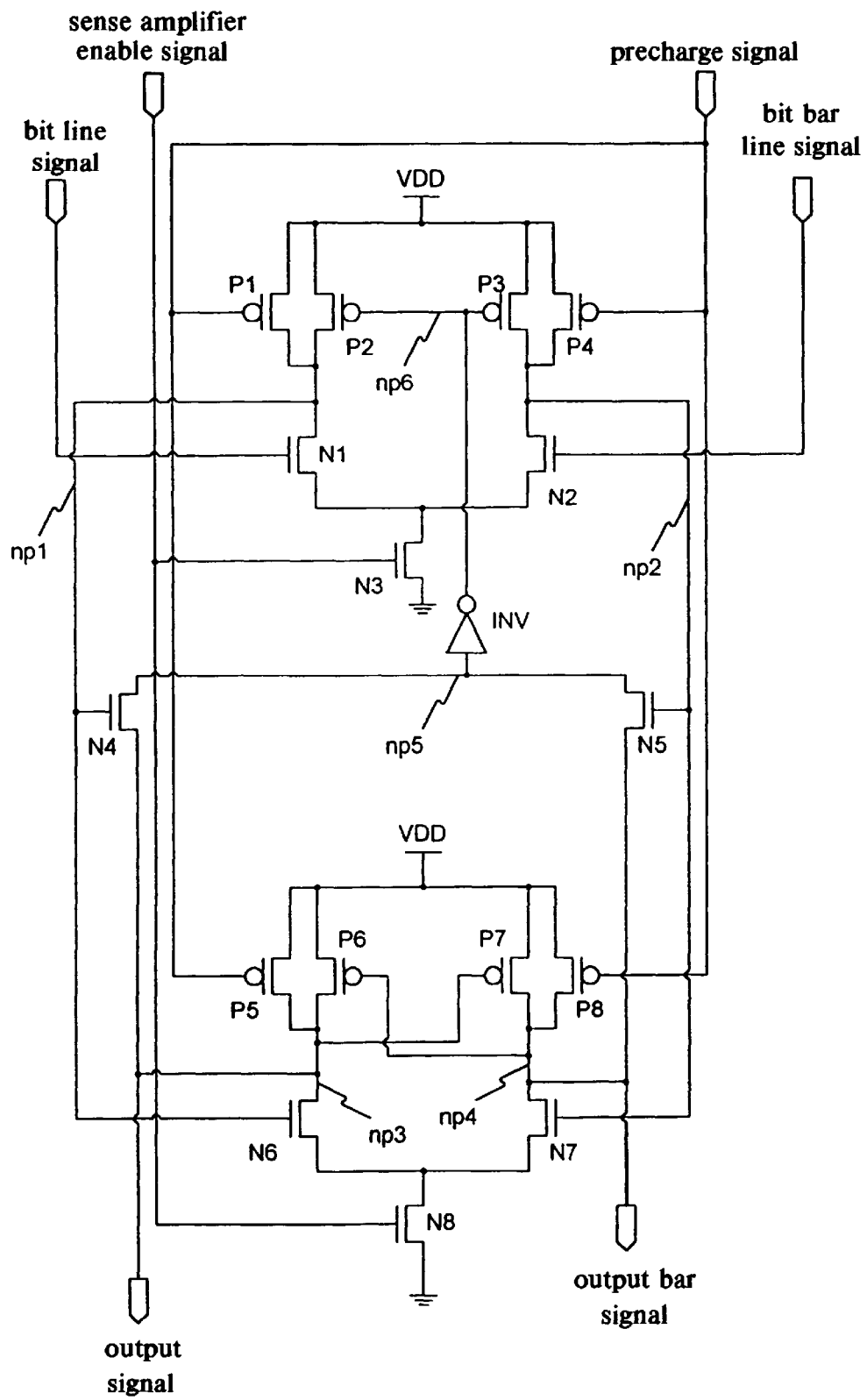
FIG. 1 shows a circuit configuration of a low-power sense amplifier in accordance with an embodiment of the present invention.

FIG. 1 shows a circuit configuration of a low-power sense amplifier in accordance with an embodiment of the present invention. Referring to FIG. 1, the low-power sense amplifier of the invention includes a differential amplifier to which a bit line signal is applied, a latch amplifier, operated by the output signal of the differential amplifier, for storing data inputted thereto, and a cutoff circuit, when there is a low-level signal in the output signals of the latch amplifier, for converting the low-level signal, to stop the operation of the differential amplifier. The differential amplifier includes a bias circuit constructed of transistors used as load resistors for its operation.

Hereinbelow, the operation of the sense amplifier according to a preferred embodiment of the present invention is explained with reference FIGS. 2A to 2E. In order to drive the sense amplifier, when a precharge signal becomes a low level, first, fourth, fifth and eighth PMOSs P1, P4, P5 and P8 each of which receives the precharge signal through its gate are all turned on. Accordingly, voltages at first to fourth node points np1 to np4 corresponding to drains of first, fourth, fifth and eighth PMOSs P1, P4, P5 and P8 become high levels. This allows fourth to seventh NMOSs N4 to N7, which use the voltages of the first and second node points np1 and np2 as their gate voltages, to be turned on. Here, the voltage at the fifth node point np5 is maintained in a high level state, identical to those of the third and fourth node points np3 and np4, due to the fourth and fifth NMOSs N4 and N5 turned on.

Accordingly, the output signal of an inverter INV, that is, the voltage of the sixth node point np6, is in a low state, turning on the second and third PMOSs P2 and P3 whose gates are connected to the output of the inverter INV. This allows the second and third PMOSs P2 and P3 to serve as load resistors, and thus the sense amplifier finishes preparing amplification of the bit line signal. In this state, when the enable signal of the sense amplifier has a high voltage level, the third and eighth NMOSs N3 and N8 whose gates receive the enable signal are turned on.

Bit line and bit bar line signals applied to the gates of first and second NMOSs N1 and N2 have opposite states to each other. In other words, when the bit line signal applied to the gate of the first NMOS N1 is a high level, the bit line signal applied to the second NMOS N2 is a low level. Accordingly, when the first NMOS N1 of the first and second NMOSs is turned on, the second NMOSs N2 is turned off, to allow the ground potential applied to the drain of the third NMOS N3, which is turned on by the enable signal, to be transferred to the drain of the first NMOS N1 turned on, converting the voltage state of the first node point np1 into a low level. The voltage of the second node point np2 is maintained in high state according to the second NMOS N2 turned off.

Accordingly, the first-stage differential amplifier starts to amplify the bit line signal and thus its two outputs, that is, the voltages of the first and second node points np1 and np2, become a high-level upper voltage and low-level lower voltage. These voltages are applied to the second-stage latch amplifier as its input signals, simultaneously, used as selection signals for the fourth and fifth NMOSs N4 and N5. Specifically, one of the two NMOSs N4 and N5 connected to the upper voltage of the differential amplifier is turned on and other transistor connected to the lower voltage is turned off.

The one of the fourth and fifth NMOSs N4 and N5, turned on by the upper voltage output of the differential amplifier, connects the output of the second-stage latch amplifier to the fifth node point np5. Accordingly, the voltages of the third and fourth node points np3 and np4 corresponding to the two output terminals of the latch amplifier are initially charged, being in the upper voltage states. However, when the sense enable signal becomes the upper voltage level and the differential amplifier starts amplification operation, the latch amplifier receives the voltages of the first and second node points np1 and np2 which correspond to the output terminals of the differential amplifier, to start amplification. Thus, one of the voltages of the third and fourth node points np3 and np4 which are output terminals of the latch amplifier is converted into the upper voltage and other one is converted into the lower voltage. Here, the output of the latch amplifier corresponding to the one of the fourth and fifth NMOSs N4 and N5 which is turned on is in a low voltage state, allowing the voltage of the fifth node point np5 also to be in a low state.

An example of the operation of the above sense amplifier is explained below. When the voltages of the first and second node point np1 and np2 have high and low levels, respectively, according to a bit line voltage, the fourth NMOS 4 is turned on but the fifth NMOS N5 is turned off. Simultaneously, the voltages of the first and second node points make the voltages of the third and fourth points np3 and np4 in low and high states, respectively, maintaining the voltage of the fifth node point np5 in the low level state according to the voltage generated by turning on the fourth NMOS N4. The voltage of the sixth node point np6 becomes a high level by means of the operation of the inverter INV which receives and inverts the voltage of the fifth point np5. Accordingly, the second and third PMOSs P2 and P3 whose gates are connected to the output terminal of the inverter INV are turned off, to allow the first-stage differential amplifier to be maintained in turned-off state, preventing power consumption at the first-stage amplifier.

Figure 2A:
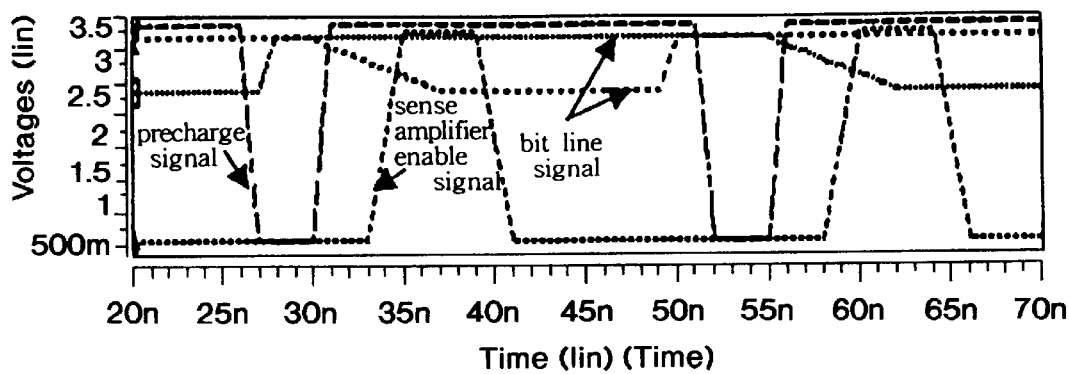
FIGS. 2A to 2E shows waveforms representing variations in signals of principal portions of the sense amplifier of FIG. 1.
Figure 2B:
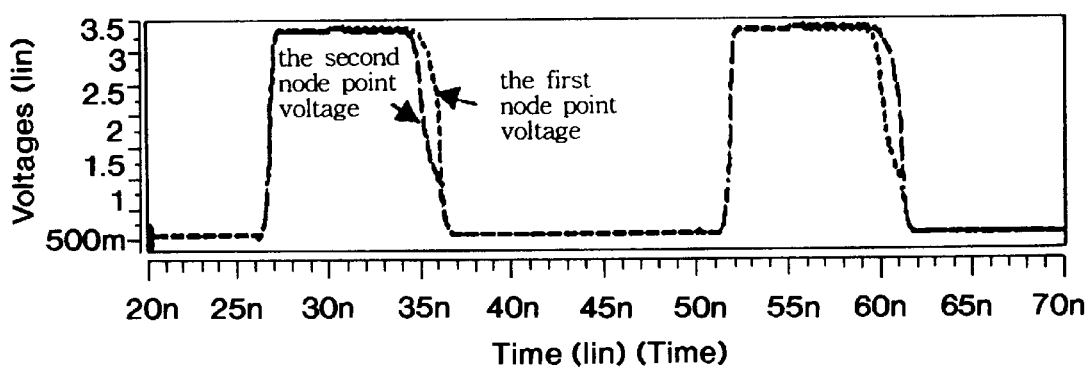
Figure 2C:
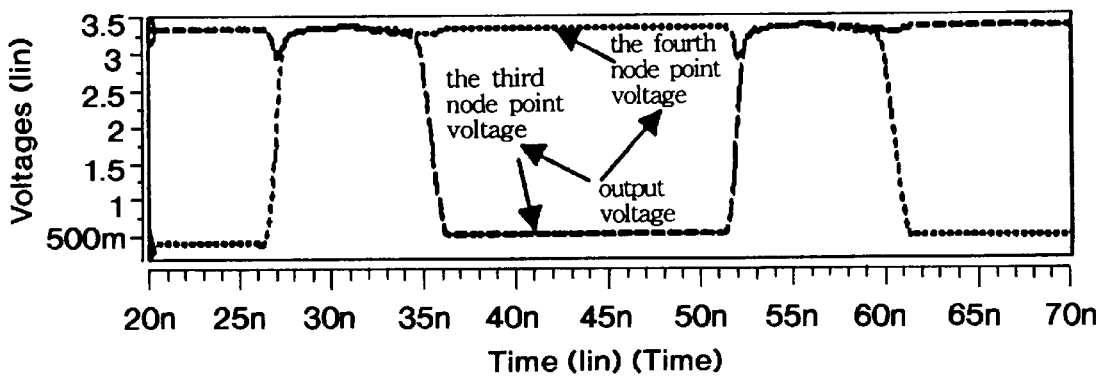
Figure 2D:
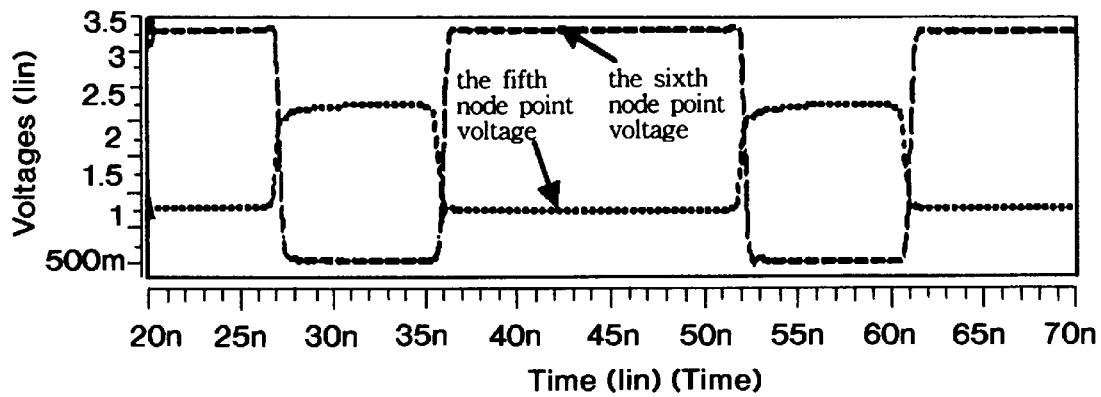

FIGS. 2A to 2E shows waveforms representing signal variations in principal portions of the sense amplifier of the invention operated as above. FIG. 2A illustrates voltage state variations of the precharge signal, sense amplifier enable signal and bit line signal. The variations in the voltages of the first and second node points np1 and np2 of FIG. 1 are shown in FIG. 2B, and the variations in the voltages of the third and fourth node points np3 and np4 of FIG. 1 are shown in FIG. 2C. Here, waveforms of the output and output bar signals become identical.

Figure 2E:
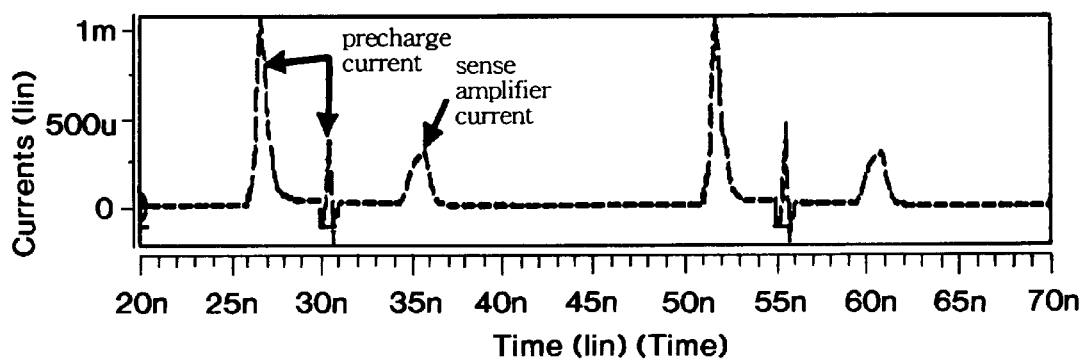

While the differential amplifier amplifies the bit line signal and outputs it, that is, the voltage of the fifth node point np5 is in a high state, the voltages at the gates of the second and third PMOSs P2 and P3 used as load resistors of the differential amplifier are maintained in a low level by means of the operation of the inverter INV. After amplification of the bit line signal, the voltage state at the sixth node point for turning off the second and third PMOSs P2 and P3 are shown as the waveform of FIG. 2D. FIG. 2E illustrates the variations in precharge current and sense amplifier current used in the sense amplifier of the invention, operated as above.

Figure 3:
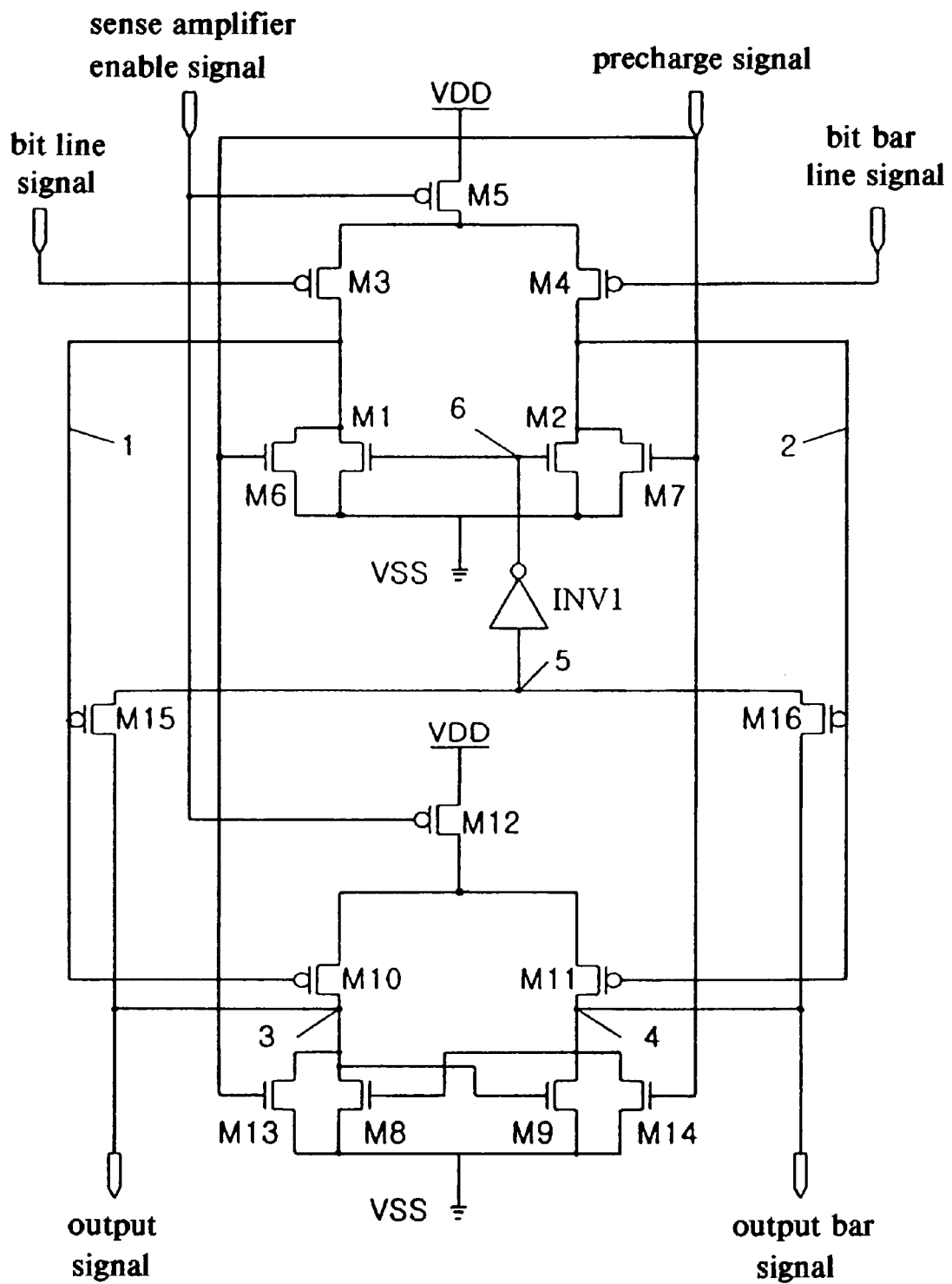
FIG. 3 shows a circuit configuration of a low-power sense amplifier in accordance with another embodiment of the present invention.

FIG. 3 shows a circuit configuration of a low-power sense amplifier in accordance with another embodiment of the present invention. In this embodiment, the operation of the sense amplifier is the same as that of the sense amplifier of FIG. 1.

According to the present invention, the low-power sense amplifier for a memory of the invention can perform high-speed sense amplification of bit line signal and prevent unnecessary power consumption.

It will be apparent to those skilled in the art that various modifications and variations can be made in the low-power sense amplifier for a memory of the present invention without departing from the spirit or scope of the invention. Thus, it is intended that the present invention cover the modifications and variations of this invention provided they come within the scope of the appended claims and their equivalents.

What is claimed is:

1. A low-power sense amplifier for a memory, comprising:
   a differential amplifier for sensing and amplifying a weak voltage signal of a bit line connected to a memory cell, said differential amplifier having bias means transistors defining a load resistor component required for driving said differential amplifier;
   a latch amplifier for storing data inputted thereto and being operated by an output signal of said differential amplifier, and cutoff means for turning off said bias means transistors when there is a first logic state signal among the output signals of said latch amplifier, said cutoff means having two transistors and an inverter, said transistors having gates connected to outputs of said differential amplifiers, drains connected to outputs of said latch amplifier, and sources connected as input to said inverter, said inverter having an output connected to said bias means transistors.

2. The sense amplifier as claimed in claim 1, wherein, said bias means transistors are PMOSs, the first logic state signal is a low-level voltage signal, and the cutoff means is an inverter.

* * * * *